United States Patent
Yang et al.

(10) Patent No.: US 7,184,302 B2
(45) Date of Patent: Feb. 27, 2007

(54) HIGHLY EFFICIENT SEGMENTED WORD LINE MRAM ARRAY

(75) Inventors: Hsu Kai Yang, Pleasanton, CA (US); Po-Kang Wang, San Jose, CA (US); Xizeng Shi, Fremont, CA (US)

(73) Assignees: Headway Technologies, Inc., Milpitas, CA (US); Applied Spintadnics, Inc., Milpitas, CA (US)

( * ) Notice: Subject to any disclaimer, the term of this patent is extended or adjusted under 35 U.S.C. 154(b) by 80 days.

(21) Appl. No.: 11/093,613

(22) Filed: Mar. 30, 2005

(65) Prior Publication Data

US 2006/0221673 A1 Oct. 5, 2006

(51) Int. Cl.
*G11C 11/00* (2006.01)

(52) U.S. Cl. .................. 365/158; 365/171; 365/173

(58) Field of Classification Search ............ 365/158, 365/171, 173
See application file for complete search history.

(56) References Cited

U.S. PATENT DOCUMENTS

| | | | |
|---|---|---|---|
| 6,335,890 B1 | 1/2002 | Reohr et al. ............ | 365/225.5 |
| 6,490,217 B1 | 12/2002 | DeBrosse et al. ........ | 365/225.5 |
| 6,711,053 B1 | 3/2004 | Tang ....................... | 365/158 |
| 6,778,429 B1 | 8/2004 | Lu et al. ................... | 365/158 |
| 6,816,405 B1 | 11/2004 | Lu et al. ................... | 365/171 |
| 6,940,749 B2* | 9/2005 | Tsang ....................... | 365/171 |
| 6,982,902 B2* | 1/2006 | Gogl et al. ................ | 365/158 |
| 2002/0176272 A1 | 11/2002 | De Brosse et al. ......... | 365/97 |
| 2004/0165424 A1 | 8/2004 | Tsang ....................... | 365/171 |
| 2004/0190360 A1 | 9/2004 | Scheuerle ................ | 365/225.7 |
| 2004/0240265 A1 | 12/2004 | Lu et al. ................... | 365/171 |

* cited by examiner

*Primary Examiner*—Richard T. Elms
*Assistant Examiner*—N Nguyen
(74) *Attorney, Agent, or Firm*—Saile Ackerman LLC; Stephen B. Ackerman (57) ABSTRACT

In an MRAM array based on MTJs, the size of segmented word line select transistors and their associated connections become a significant overhead, especially when the operating point is chosen deep along the hard axis of the asteroid curve. This problem has been overcome by placing the big segmented word line select transistors under the MTJ array and reducing the overall MRAM cell array down to a level comparable to a simple Cross Point MRAM array.

20 Claims, 10 Drawing Sheets

FIG. 10B

HIGHLY EFFICIENT SEGMENTED WORD LINE MRAM ARRAY

FIELD OF THE INVENTION

The invention relates to magnetic random access memory (MRAM) cell array architecture and more specifically to arrays having segmented word lines where the word line programming current goes through only a segment of cells along the word line.

BACKGROUND OF THE INVENTION

MTJs (Magnetic Tunnel Junctions) may be programmed at the intersections of Word Line and Bit Line currents in MRAM cells. The possibility of cells along the same word and bit lines being disturbed is, however, a major concern. A Segmented Word Line approach, as described in "Select Line Architecture for Magnetic Random Access Memories" (US Patent Application Publication: US 2002/0176272 A 1), eliminated disturb conditions for cells on the same word line outside the selected segment. When the operating point is chosen deep along the hard axis, the required bidirectional bit line currents to program the selected cells are significantly reduced. The possibility of a disturb along the bit line is also reduced. This is an ideal MRAM operating condition but the silicon area overhead due to the large size of the segmented word line select transistor makes widespread application impractical.

Figure 1:
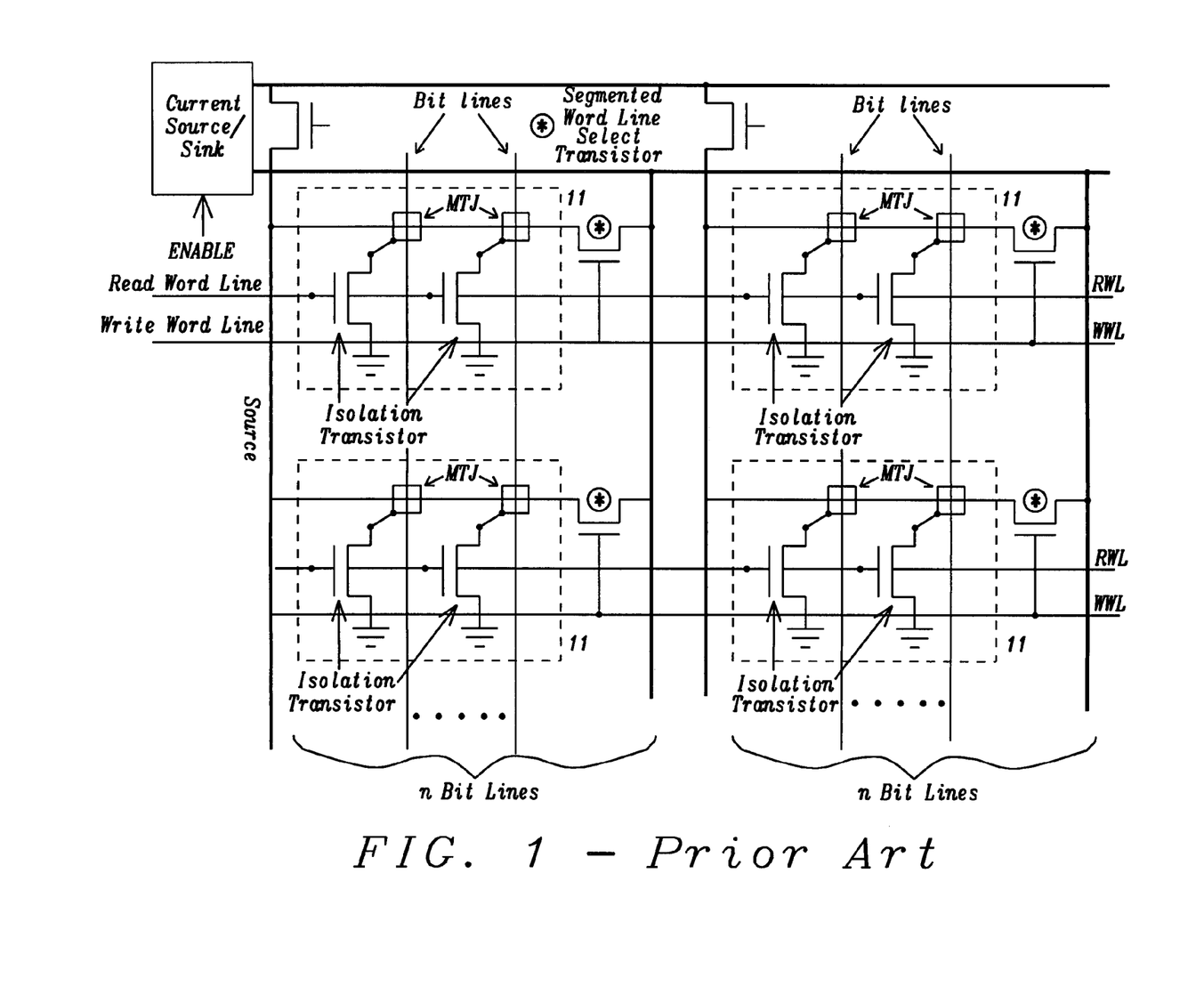
FIG. 1. A Segmented Word Line MRAM array of the Prior Art

In FIG. 1, a typical segmented word line array is shown. Since the word line programming current only goes through the selected Segmented Word Line Source, the selected word line segment and the word line segment select a transistor to Ground or a Segmented Word Line Return, any MTJs 11 outside this word line segment being unaffected by this programming current.

Figure 2:
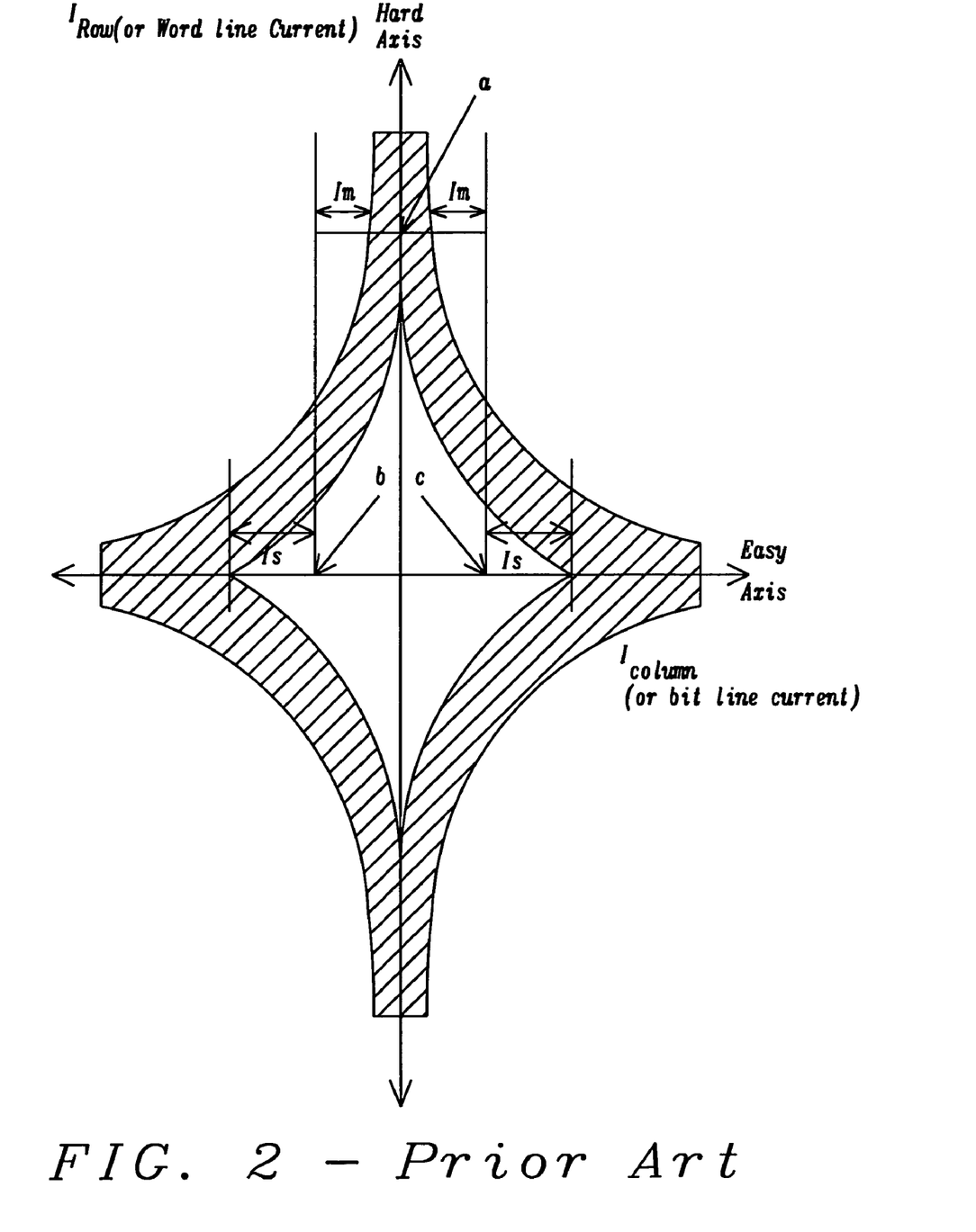
FIG. 2. A Composite Asteroid Chart of MTJs within an MRAM array.

In FIG. 2, the composite characteristics of MTJs within an array are shown on an asteroid chart as the shaded areas. With a segmented word line MRAM array, the word line current can be biased deep into the region where only very small bi-directional bit line currents are needed to program the MTJs. As an example, when a Word Line current is biased at point a and the bi-directional bit line currents are biased at points b and c, the margins to ensure programming of all bits within the array are shown as Im and the safety margins for not disturbing any bits along the bit lines are shown as Is.

This mode of word line current biasing requires every bit within the selected word line segment to be programmed in one direction or the other. Otherwise, they will end up in random states. The Word Line bias current required in this condition is high, therefore the size of a Segmented Word Line Select Transistor will be a big overhead compared with the number of cells (or bit lines) within an selected segment.

In a conventional approach, as seen in FIG. 1, each MTJ 11 is isolated by a transistor. This transistor has to be placed directly underneath the MTJ when laying out and constructing the MRAM array. Therefore, the big Segmented Word Line Select Transistor must be placed adjacent to the segment. This transistor and its associated connection area are a big overheads of the segmented word line approach. By using one single isolation transistor for many or all the MTJs within a word line segment, the isolation transistor (or transistors) will not take up all the area beneath the MTJs, leaving room for the Segmented Word Line Select Transistor. However, there are several undesirable effects of using a single isolation transistor for several MTJs.

Since the sensing currents of all MTJs within a word line segment will flow through a single isolation transistor, the voltage on the Common Bottom Electrode node will vary depending on the resistance states (i.e. Data Pattern). The size of the Common Isolation Transistor needs to be large to reduce this effect. Another undesirable effect of using a single isolation transistor is the fairly big voltage difference, depending on bit line resistance and bit line programming current values, between bit lines in a big array during Write due to the bidirectional nature of Bit Line programming currents. This big potential difference between adjacent bit lines within a word line segment can damage MTJs and reduce programming current.

A routine search of the prior art was performed with the following references of interest being found:

U.S. Pat. No. 6,335,890 (Roehr et al) discloses global and local word lines where the global word lines are isolated from the memory cells, write lines and bit lines orthogonal, and a switch for each word line segment. U.S. Pat. No. 6,490,217 and U.S. patent application 2002/0176272 (DeBrosse et al) show 1 transistor for each MRAM element.

U.S. Pat. No. 6,816,405 and U.S. patent applications 2004/0240265 (Lu et al) shows a local word line associated with each segment where the local word line is connected to a switch at one end and the a global word line at the other end. Local and global bit lines do not seem to be disclosed. U.S. Pat. No. 6,778,429 (Lu et al) also includes current sinks couplable to global word lines. U.S. Pat. No. 6,711,053 (Tang) discloses a switching device (transistor) for each MTJ.

U.S. Patent Application 2004/0190360 (Scheuerlein) shows word line segments connected vertically without segment switching devices. U.S. patent application 2004/0165424 (Tsang) teaches segmented word lines and segmented bit lines.

SUMMARY OF THE INVENTION

It has been an object of at least one embodiment of the present invention to provide a method for reducing the space overhead in a segmented MRAM array associated with the large size of the segmented word line select transistor Another object of at least one embodiment of the present invention has been to provide a circuit wherein said method has been implemented.

A further object of at least one embodiment of the present invention has been to show how said circuit may be constructed.

Still another object of at least one embodiment of the present invention has been to reduce the overall MRAM cell array down to a level comparable to a simple Cross Point MRAM array, while still retaining the benefits of a segmented array.

These objects have been achieved by showing how to reduce silicon area overhead by using one common isolation transistor for all the bits within a segment, instead of one isolation transistor per bit. The resulting freed silicon area can be used for the segmented word line select transistor thus significantly reducing silicon area in the word line direction.

The invention further teaches how to minimize the MRAM cell array in the bit line direction, such that the resulting MRAM array is comparable to the smallest Cross Point MRAM cell array while maintaining the high performance and ease of implementation characteristics of a one MTJ, one isolation transistor, MRAM cell array.

DETAILED DESCRIPTION OF THE PREFERRED EMBODIMENTS

The prior art problem of the silicon area overhead due to the large size of the segmented word line select transistor has been solved by introducing separate Programming Bit Lines, which do not themselves contact the MTJs. Since the bottom sides of all MTJs within a word line segment are connected, leakage currents between Bit Lines can be significant in a large array that is in Read Mode. Connecting only a segment of the Local Bit Lines to the Global Bit Lines minimizes this leakage current. Segmented Word Line arrays often require separate Read Word Line and Write Word Line Busses to avoid damaging the MTJ during Write. By isolating the topside of the MTJ from the Write Bit Line, the Read Word Line and Write Word Line signals of a conventional segmented word architecture can be combined into a single Read Word Line/Write Word Line.

Figure 3:
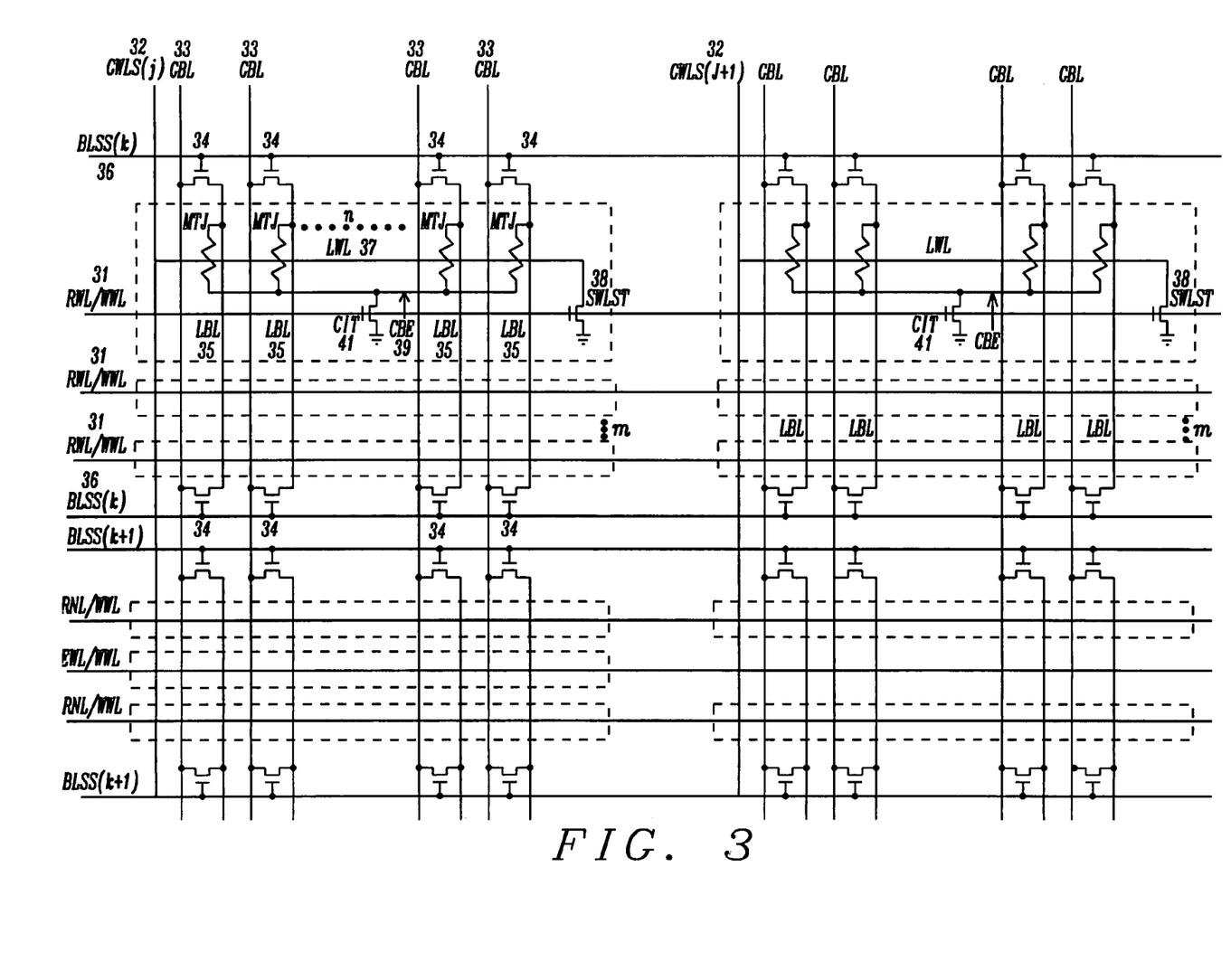
FIG. 3. A Highly Efficient Segmented Word Line MRAM Array Schematic.

These ideas and concepts are embodied FIG. 3 to which we now refer. During the Program Cycle, only one of the Local Word Line segments carries the Word Line Programming current which is controlled by selecting one of the RWL/WWL (Read Word Line/Write Word Line)s 31 and one of the Global Word Line Sources 32.

Bidirectional Bit Line currents through one set of Global Bit lines 33 will program the bits at this intersection. All Bit Line Segment Select Transistors 34 are OFF, isolating Local Bit Lines 35 from Global Bit Lines 33.

During the Read Cycle, only one of the Read Word Line/Write Word Lines 31 is selected. All Global Word Line Sources 32 are turned off (at GND level). One set of Bit Line Segment Selects 36, in which the selected RWL/WWL is located, is selected. The Global Bit Lines 33 within the selected word line segment are connected to (or further decoded and then connected to) sense amplifiers (not shown).

Figure 4:
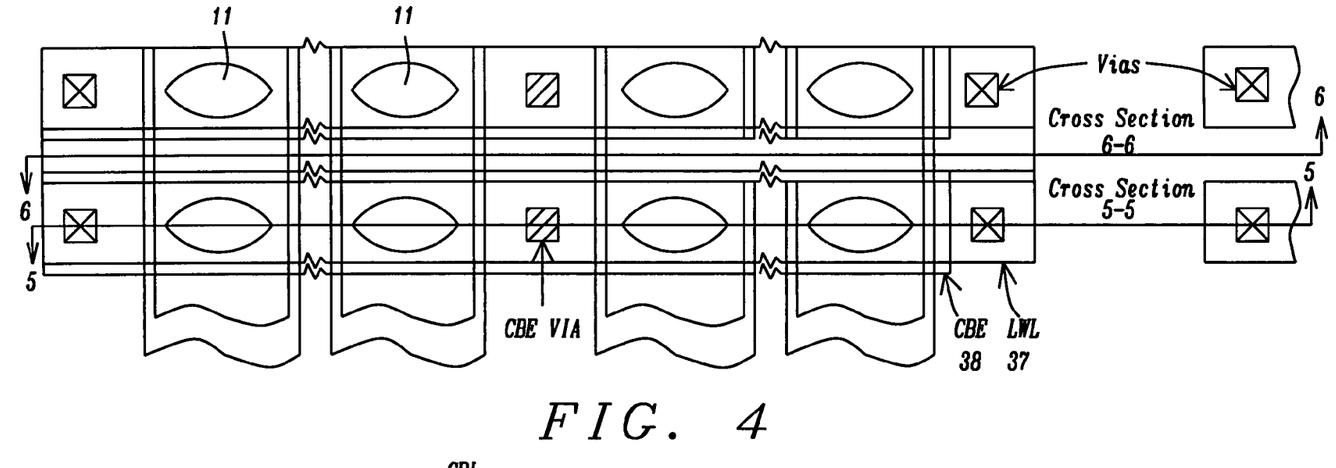
FIG. 4. A plan view showing MTJ, Local Word Line, Global Bit Line, Local Bit Line, and Common Bottom Electrode.
Figure 5:
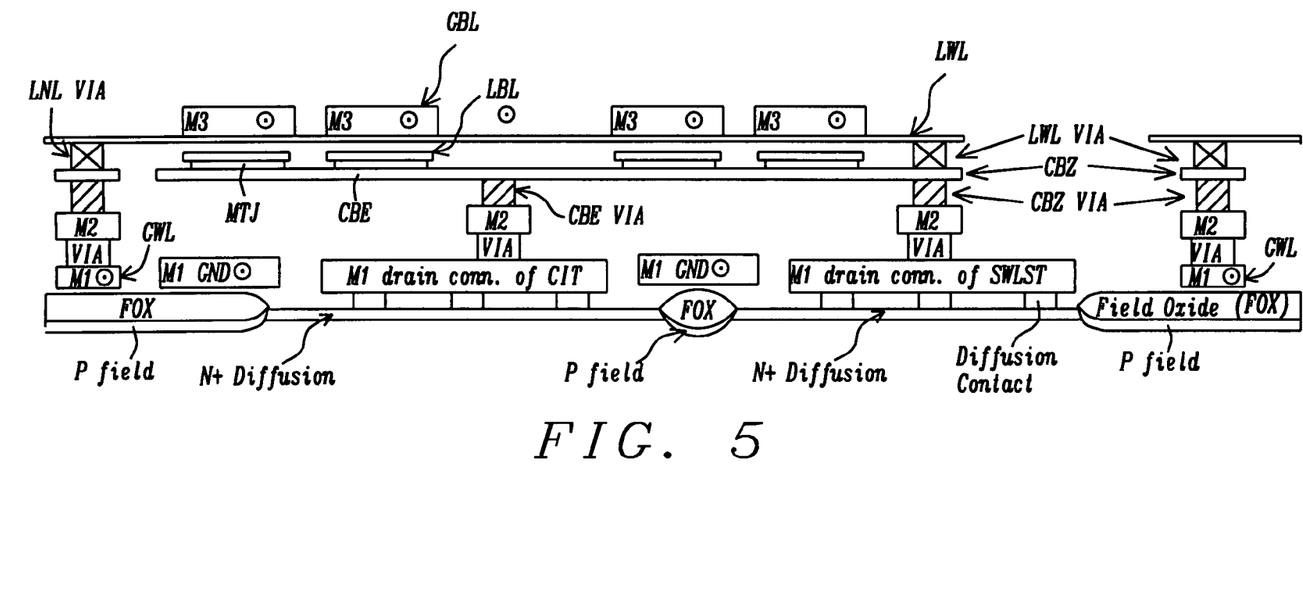
FIG. 5. Cross Section 5—5 of FIG. 4 (Global Bit Line on Top)
Figure 6:
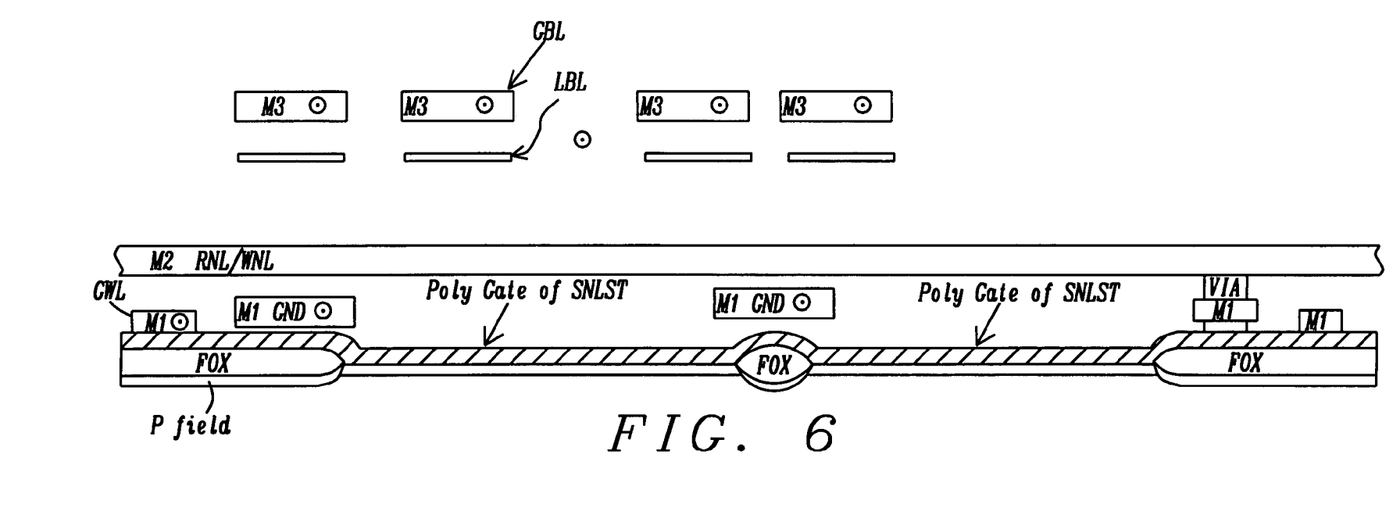
FIG. 6. Cross Section 6—6 of FIG. 4 (Global Bit Line on Top)

This array can be implemented in two ways. A plan view (excluding the underlying semiconductor components and interconnects) is shown in FIG. 4. Two cross sections, 5—5 and 6—6, illustrate exemplary bottom structures. Cross Section 5—5 is cut through the MTJ related layers and the drains/sources of the MOSFETs while cross section 6—6 avoids the MTJs to show the Global Bit Lines 33, Local Bit Lines 35, and Metal 1, used as GND buses that run normal to the plane of the figure. It can be shown that the structures below the MTJ-related layers may be optimized separately, with many variations possible. The two cross sections shown here serve only as examples of structures that are possible beneath the MTJ-related layers and how they might relate to one another. They are not necessarily complete in every last detail.

In FIGS. 5 and 6, the Global Bit Line 33 is above the MTJs, Local Bit Lines 35, and Local Word Lines 37 (seen in FIG. 3).

Figure 7:
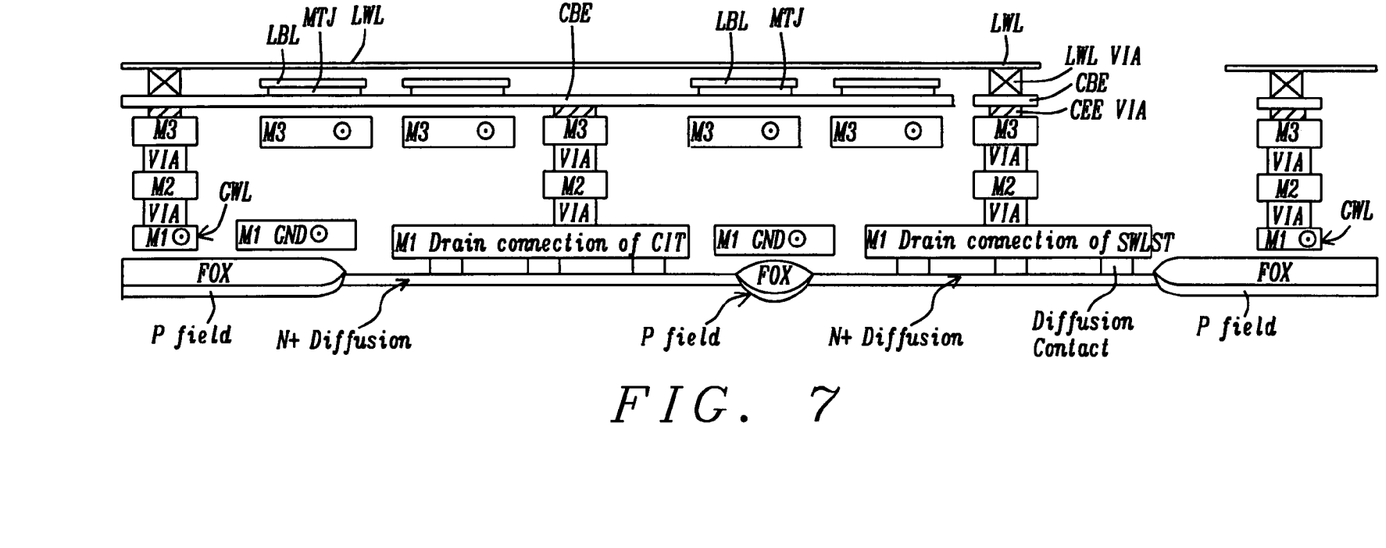
FIG. 7. Cross Section similar to 5—5 but with the Global Bit Line under the MTJs FIG. 8. Cross Section similar to 6—6 but with the Global Bit Line under the MTJs FIGS. 9A and B Silicon Level layouts to minimize the cell pitch in the bit line direction.
Figure 8:
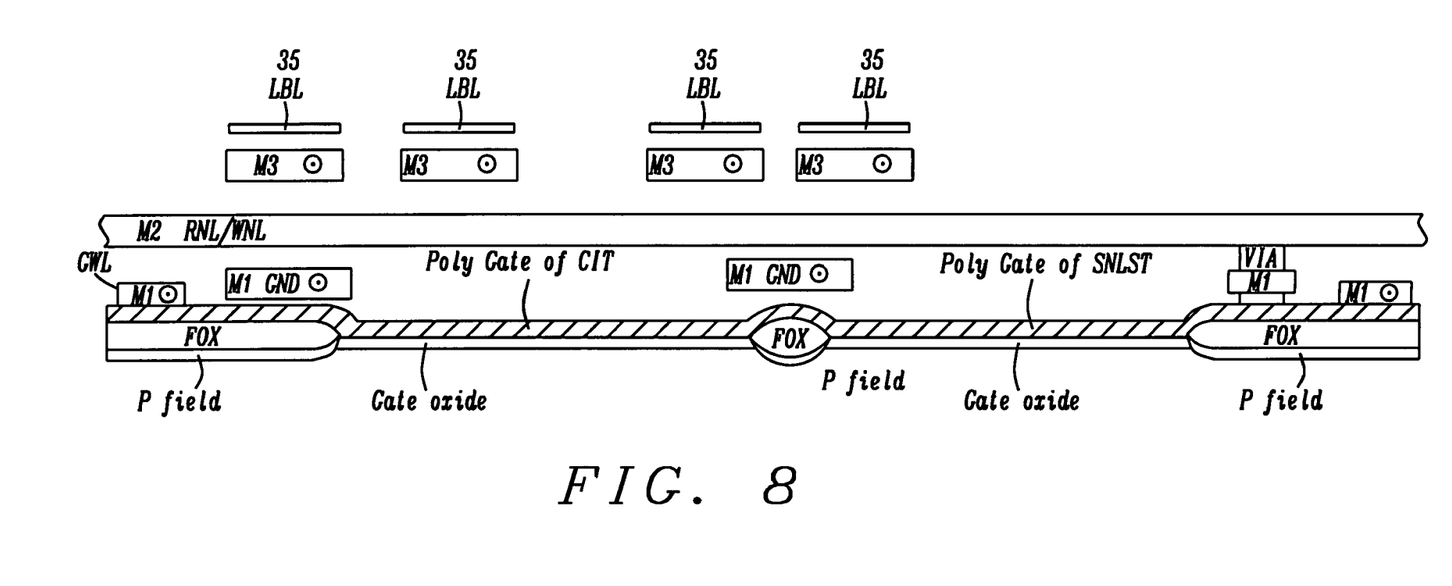

In another embodiment (FIGS. 7 and 8), the Global Bit Line 33 is below the MTJs 11 as well as Common Bottom Electrode 39 to which is connected common isolation transistor 41 (see FIG. 3). Thus the invention also eliminates the one contact per cell from the bottom MTJ electrode to the isolation transistor.

The pitch along the bit line direction can therefore be reduced to the MTJ pitch, limited as a Cross Point MTJ MRAM cell, assuming that the underlying silicon level (MOSFETs and metal 1), and the required interconnects buses for this MRAM, can be constructed within this pitch.

Figure 9A:
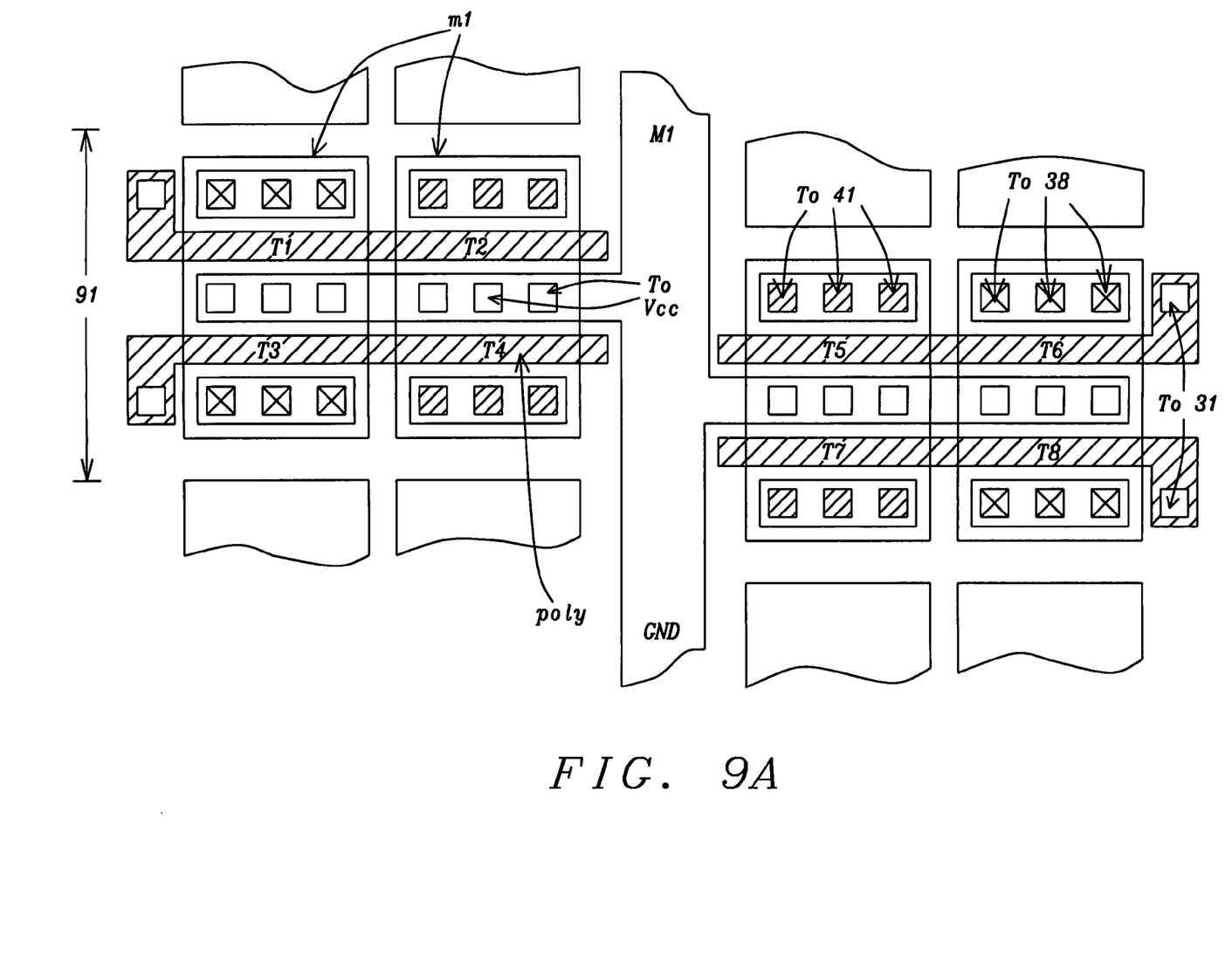
Figure 9B:
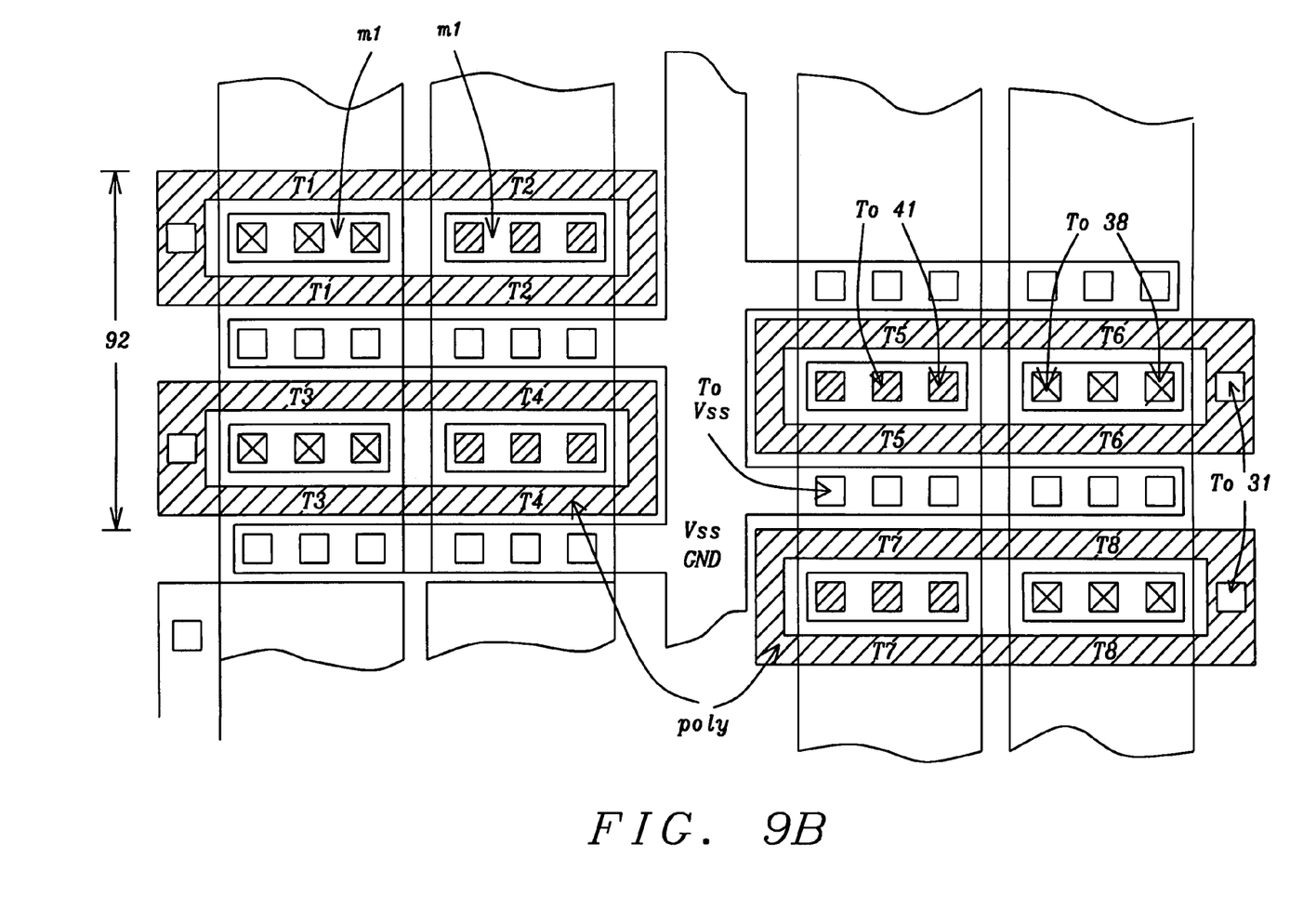

Based on the same generation lithography rules for MTJs and production CMOS, two embodiments for the silicon level layout are shown in FIGS. 9A and 9B. In FIG. 9A the Silicon Level Layout shows how 8 MOSFETs (T1–T8) could be fitted into 4 segmented word line pitches 91; each word line segment will require two MOSFETs (one for the isolation transistor 41 and one for the Segmented Word Line Select Transistor 38). This layout normally results in minimum silicon level pitch in the direction of the bit line. It is normally smaller than 4 pitches of the MTJs.

FIG. 9B is another embodiment for fitting 8 MOSFETs in 4 pitches. In this embodiment the pitch 92 is larger than in FIG. 9A, but the MOSFET width is doubled, therefore their ON resistance is reduced proportionally. Since both the Word Line Segment Select Transistor and the Isolation Transistor require low ON resistance, this becomes an ideal implementation.

Figure 10A:
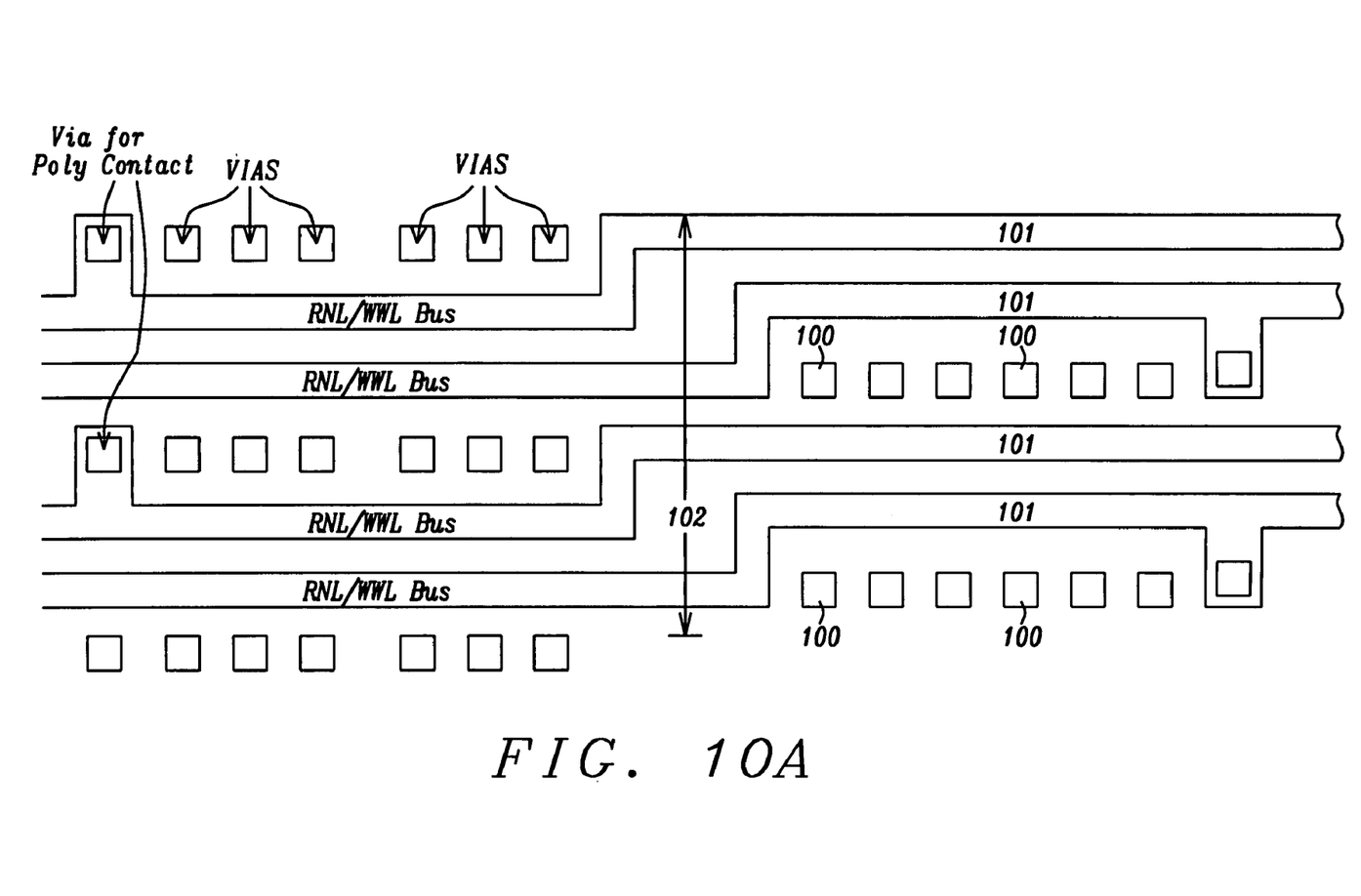
FIGS. 10A and B Interconnect layers between MTJ related layers and Silicon Level layers.

There is another pitch that could be the limiting factor of this MRAM array. That is the VIA that is needed to connect the Bottom Electrode of the MTJs and Local Word Lines to the drains of MOSFETs and the metal buses needed to shunt RWL/WWL. In FIG. 10A. two rows of VIAs 100 are shown with 4 metal buses 101 for 4 segmented word line pitches 102.

Figure 10B:
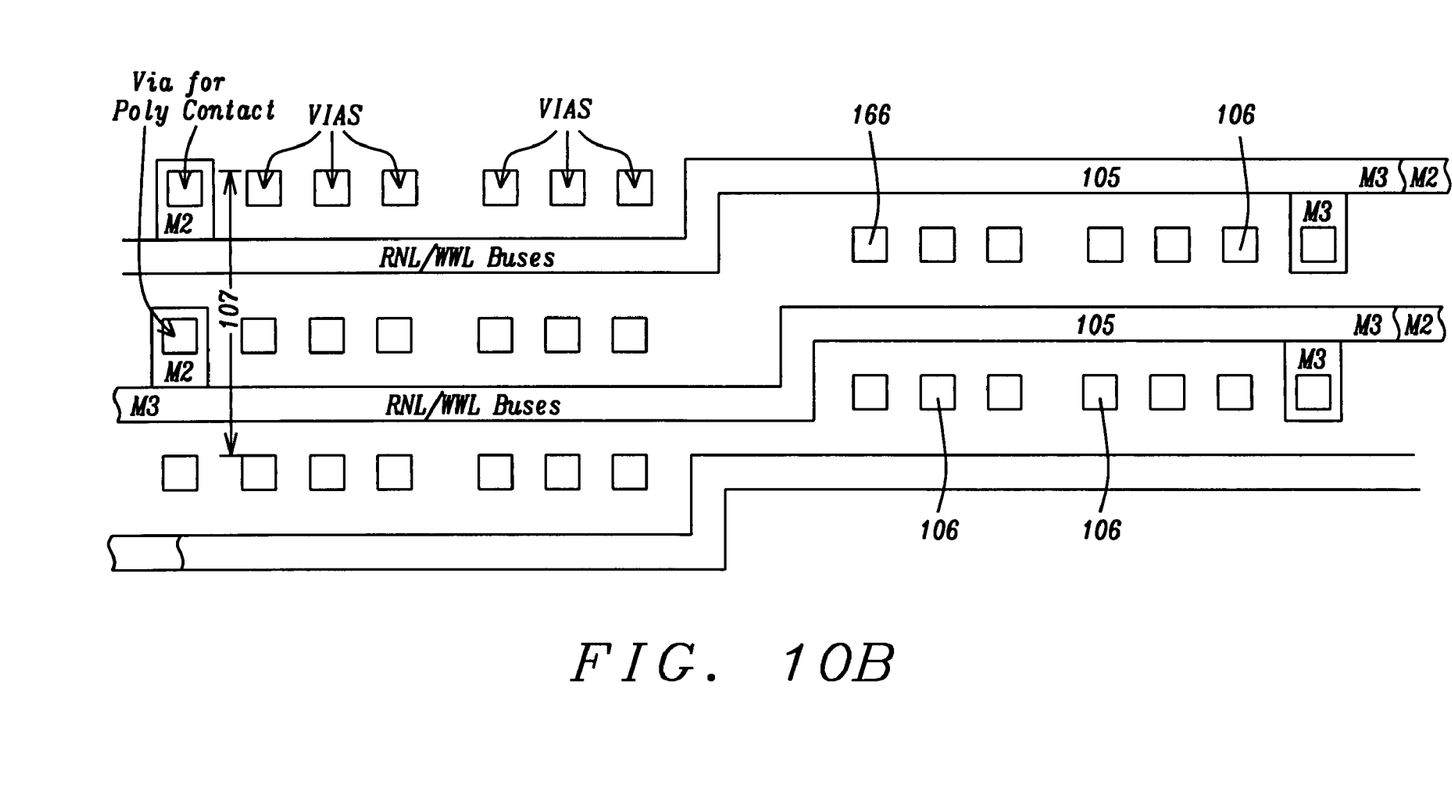

FIG. 10B shows two rows of VIAs 106 and 2 layers of 2 metal buses 105 for 4 segmented word line pitches 107. In this latter embodiment, the total pitch is smaller, but 2 layers of interconnecting metal are needed.

The MTJs, silicon level, and VIA/interconnect layers can be optimized individually and separately making it possible to design a high performance MRAM array, having the same order of areal efficiency as a Cross Point cell array and its associated benefits, of segmented word line MRAM cells with isolation transistors 41.

What is claimed is:

1. A method to reduce area occupied by a MRAM array having word lines whose action is local to a segment of said MRAM, comprising:

providing a number of MTJs that have a common bottom electrode;

providing a global word line current source;

through a segmented word line select transistor, connecting a local word line to said global word line current source, said local word line being limited to interacting with only said MTJs in said segment;

passing said number of global bit lines through said MRAM segment;

for each global bit line in said segment, providing a local bit line, having first and second ends, that is limited to said segment and that does not overly an MTJ;

providing first and second segment select bit lines disposed to lie on opposing sides of said segment;

connecting said first and second ends of each local bit line to the same global bit line through transistors whose control gates are connected to said first and second segment select bit lines respectively;

connecting each local bit line to said common bottom electrode through a line that allows said local bit line to interact with an MTJ;

connecting said common bottom electrode to a single common isolation transistor whereby said area reduction is achieved;

then activating said local bit line isolation transistor and said read selection transistor; and sending a sense current through said MRAM to a current sink via said global bit line, said local bit line isolation transistor, said local bit line, and a read selection transistor thereby sensing information stored in a single MTJ.

2. The method recited in claim 1 further comprising using said global bit line for both writing and reading.

3. The method recited in claim 1 further comprising disconnecting said local bit line from said global bit line during a writing process whereby said local bit line is used for reading only.

4. The method recited in claim 1 further comprising magnetically decoupling said first global word line from said magnetic storage device and then using said first global word line as a bus line for delivering a word write current to said local write word line.

5. A space saving MRAM array having word lines whose action is local to a segment of said array, comprising:

a number of MTJs that have a common bottom electrode;

a global word line current source;

a local word line, connected through a segmented word line select transistor, to said global word line current source, said local word line being limited to interacting with only said MTJs in said segment;

said number of global bit lines passing through said MRAM segment;

for each global bit line in said segment, a local bit line, having first and second ends, that is limited to said segment and that does not overly an MTJ;

first and second segment select bit lines disposed to lie on opposing sides of said segment;

said first and second ends of each local bit line being connected to the same global bit line through transistors whose control gates are connected to said first and second segment select bit lines respectively;

each local bit line being connected to said common bottom electrode through a line that allows said local bit line to interact with an MTJ; and said common bottom electrode being connected to a single common isolation transistor.

6. The MRAM array according to claim 5 wherein said global bit line is used for both writing and reading processes.

7. The MRAM array according to claim 5 wherein said local bit line is used for reading only, being disconnected from said global bit line during a writing process.

8. The MRAM array according to claim 5 wherein said first global word line is magnetically decoupled from said magnetic storage device and then used as a bus line for delivering a word write current to said local write word line.

9. The MRAM array according to claim 5 wherein said local write word line is magnetically coupled to more than one of said magnetic storage devices.

10. The MRAM array according to claim 5 wherein said read selection transistor is connected to more than one of said magnetic storage devices.

11. The MRAM array according to claim 5 wherein said local write word line is located above said local bit line.

12. The MRAM array according to claim 5 wherein said global bit line is located above said local word line.

13. The MRAM array according to claim 5 wherein said global bit line is located beneath said common bottom electrode.

14. A MRAM array, comprising:

a magnetic storage device having a bottom electrode and a top layer;

a global bit line;

parallel to said global bit line, a local bit line having two ends and connected to said global bit line at said ends through two isolation devices, each of which is connected to said top layer;

parallel to said global bit line, a first global word line;

orthogonal to said first global word line, a local write word line, magnetically coupled to said magnetic storage device and connected to said first global word line, at a first end and, through a word selection transistor, and to a ground line at a second end;

a read selection transistor whose drain is connected to said bottom electrode and whose source is grounded; and orthogonal to said first global word line, a second global word line that controls both said local write word line selection transistor and said read selection transistor.

15. The MRAM array according to claim 14 wherein said global bit line is used for both writing and reading processes.

16. The MRAM array according to claim 14 wherein said local bit line is used for reading only, being disconnected from said global bit line during a writing process.

17. The MRAM array according to claim 14 wherein said first global word line is magnetically decoupled from said magnetic storage device and then used as a bus line for delivering a word write current to said local write word line.

18. The MRAM array according to claim 14 wherein said local write word line is magnetically coupled to more than one of said magnetic storage devices.

19. The MRAM array according to claim 14 wherein said read selection transistor is connected to more than one of said magnetic storage devices.

20. The MRAM array according to claim 14 wherein said local write word line is located above said local bit line.

* * * * *

UNITED STATES PATENT AND TRADEMARK OFFICE
CERTIFICATE OF CORRECTION

PATENT NO. : 7,184,302 B2 Page 1 of 1
APPLICATION NO. : 11/093613
DATED : February 27, 2007
INVENTOR(S) : HsuKai Yang, Po-Kang Wang and Xizeng Shi It is certified that error appears in the above-identified patent and that said Letters Patent is hereby corrected as shown below:

On Title Page
In the Assignee, Item (73), delete, "Applied Spintadnics, Inc., Milpitas, CA (US)" and replace with -- Applied Spintronics, Inc., Milpitas, CA (US) --.

Signed and Sealed this

Eighteenth Day of December, 2007

JON W. DUDAS
*Director of the United States Patent and Trademark Office*